United States Patent [19]
Derbenwick et al.

[11] Patent Number: 6,031,754
[45] Date of Patent: Feb. 29, 2000

[54] FERROELECTRIC MEMORY WITH INCREASED SWITCHING VOLTAGE

[75] Inventors: Gary F. Derbenwick, Colorado Springs; David A. Kamp, Monument; Michael Cordoba; George B. Coombe, both of Colorado Springs, all of Colo.

[73] Assignee: Celis Semiconductor Corporation, Colorado Springs, Colo.

[21] Appl. No.: 09/184,474

[22] Filed: Nov. 2, 1998

[51] Int. Cl.$^7$ .............................. G11C 11/22; G11C 7/00
[52] U.S. Cl. ........................ 365/145; 365/149; 365/203
[58] Field of Search .................................. 365/145, 149, 365/203

[56] References Cited

U.S. PATENT DOCUMENTS

| | | |
|---|---|---|
| 2,876,436 | 3/1959 | Anderson . |
| 4,873,664 | 10/1989 | Eaton, Jr. . |
| 4,888,733 | 12/1989 | Mobley . |
| 5,029,128 | 7/1991 | Toda . |
| 5,198,706 | 3/1993 | Papaliolios ............................. 365/145 |
| 5,406,510 | 4/1995 | Mihara et al. . |
| 5,487,030 | 1/1996 | Drab et al. ............................. 365/145 |
| 5,523,964 | 6/1996 | McMillan et al. . |
| 5,541,872 | 7/1996 | Lowrey et al. ........................ 365/145 |
| 5,751,627 | 5/1998 | Ooishi ..................................... 365/145 |
| 5,768,176 | 6/1998 | Katoh ..................................... 365/145 |

*Primary Examiner*—Trong Phan
*Attorney, Agent, or Firm*—Duft, Graziano & Forest, P.C.

[57] ABSTRACT

A ferroelectric integrated circuit memory includes a memory cell having a ferroelectric capacitor, one electrode of which is connected to a bit line through a transistor, and the other electrode of which is connected to a plate line. The bit line is also connected to system ground through a precharge transistor. In a read cycle, the precharge transistor remains on after the word line goes high connecting the capacitor to the bit line. At least a portion of the linear displacement current that flows to the bit line is drained off to ground via the precharge transistor, thereby increasing the switching voltage across the ferroelectric capacitor. The precharge transistor is turned off before or during the switching of the ferroelectric capacitor. The signal applied to the gate of the precharge transistor is boosted above the supply voltage of the memory to shorten the cycle time.

25 Claims, 6 Drawing Sheets

FERROELECTRIC MEMORY WITH INCREASED SWITCHING VOLTAGE

BACKGROUND OF THE INVENTION

1. Field of the Invention

The invention in general relates to ferroelectric electronic memories and more particularly to an apparatus and method for reading and/or writing a ferroelectric storage element in a memory cell.

2. Statement of the Problem

It is well-known that ferroelectric materials are capable of retaining a polarization which can be used to store information in a non-volatile memory. For example, if a strong enough electric field or voltage is placed across a ferroelectric capacitor, when the voltage is removed, a polarization in the direction of the field remains. If the field is then placed across the same capacitor in the opposite direction, the ferroelectric material switches, and when the field is removed, a polarization in the opposite direction remains. Electronic circuits have been designed to associate the polarization in one direction with a digital logic "1" state, and polarization in the opposite direction with a logic "0" state. See, for example, the circuits described in U.S. Pat. No. 2,876,436 issued to J. R. Anderson on Mar. 3, 1959; U.S. Pat. No. 4,873,664 issued to S. Sheffield Eaton, Jr.; U.S. Pat. No. 5,029,128 issued to Haruki Toda; and U.S. Pat. No. 5,406,510 issued to Takashi Mihara, et. al. These circuits include memory cells arranged in rows and columns, each memory cell including at least one switch, a capacitor having a pair of plate electrodes, and the memory also including plate lines connected to one plate of the capacitor in each cell, bit lines connected to the other plate of the capacitor through the switch. In the latter three patents the switch is a transistor having a gate and a pair of source/drains. Each of the latter circuits also include word lines connected to the control gate of the transistor. The transistor acts as a switch controlled by its gate, to connect the capacitor to the bit line. Information is written into a memory cell by placing either a high or a low voltage on the bit line, turning the transistor on to connect the bit line to the capacitor, and placing a predetermined voltage between the high and low voltage on the plate line. The circuit of the Anderson patent is essentially the same, except the voltage applied to the bit line turns on the diode switch. The high voltage causes the memory cell to assume one polarization state, and the low voltage causes the memory cell to assume the opposite polarization state. The memory cell is read by creating a voltage difference between the bit line and plate line and sensing in some manner the presence or absence of a ferroelectric switching charge or current caused by the switching of the ferroelectric.

A problem with the ferroelectric memories disclosed in the above references is that when a switching voltage is placed across the ferroelectric capacitor, a charge flows from the capacitor into the bit line prior to the switching of the ferroelectric. In the specific memories discussed above, this extra charge or current is due to the linear capacitance of the ferroelectric capacitor, which is often called the linear displacement current or linear charge, but shall be referred to herein as the linear current or linear charge for simplicity. This charge alters the voltage on the bit line to a voltage closer to the voltage on the plate line, and thus reduces the voltage available to switch the ferroelectric capacitor. That is, the voltage available to switch the ferroelectric capacitor is significantly less than the full voltage available in the circuit as determined by the supply voltage. This problem of the reduction of the voltage available to switch the ferroelectric material occurs in most other ferroelectric memory designs in addition to those discussed above, but has been discussed in terms of these particular memories to provide a clear illustration of the problem, and since these are the most common types of ferroelectric memories, and the fastest ferroelectric memories presently available use designs similar to the designs in these references. This problem can have many impacts on the memory: it can create a need for a higher supply voltage, it can slow the switching process, and can result in errors due to inaccurately reading to or writing to the memory, all of which either make the memory less efficient, less reliable, more expensive to manufacture or a combination thereof.

One solution to the above problem is disclosed in U.S. Pat. No. 4,888,733 issued to Kenneth J. Mobley. In the memory disclosed in the Mobley patent, each memory cell includes two transistors, and the cell is read by pulsing the ferroelectric capacitor first in one direction, and storing the resulting charge flow in a first linear capacitor, then pulsing the ferroelectric capacitor in the opposite direction and storing the resulting charge flow in a second linear capacitor, then comparing the charges in the two capacitors. The linear current flow cancels out in this process. However, the process is time consuming, resulting in a slow memory read time, and it also requires the extra circuitry including at least one additional transistor per memory cell as well as the extra transistors and capacitors in the sensing circuit.

It would be highly desirable to have a ferroelectric memory in which essentially the full supply voltage is applied to switch the ferroelectric material, and at the same time was essentially as fast and as simple as the memory of the Mihara patent referenced above, for example.

3. Solution to the Problem

The present invention solves the above problem by connecting the bit line to a current sink during the initial portion of a read cycle. The current sink draws off the linear charge from the bit line, allowing essentially the full voltage as determined by the supply voltage to be applied across the ferroelectric material.

As known in the art, a memory could also be designed with the high and low voltages interchanged. In this case, the problem would be rephrased as the bit line voltage being lowered by the linear current, and the current sink would be replaced with a current source which would maintain the bit line at essentially the full high voltage during the initial portion of a read cycle.

In the ferroelectric memories disclosed in the Eaton, Toda, and Mihara patents discussed above, as well as other ferroelectric memories, the bit line is precharged to zero volts by connection to ground prior to the initiation of the read cycle. In such memories, the invention may be implemented simply by maintaining the electrical connection to the precharge circuit into the initial portion of the read cycle. In other words, the disconnection from the precharge circuit is delayed until the voltage across the capacitor rises to essentially the full potential difference as determined by the supply voltage, and the majority of the linear charge flows into the bit line. Thus, the linear charge will be drained away to ground via the precharge circuit, and will not reduce the voltage across the ferroelectric capacitor.

The precharge circuit in conventional memories includes a transistor connecting the bit line to circuit ground. Preferably, the precharge signal applied to the precharge transistor is boosted, increasing the current flow through the transistor and accelerating the removal of charge from the bit line, thereby reducing the cycle time.

The invention provides a ferroelectric integrated circuit memory comprising: a memory cell comprising a ferroelectric memory element capable of storing a linear charge and a ferroelectric charge; a sense line connected to or connectable to the ferroelectric memory element; a current source/sink; a linear charge switch connected between the current source/sink and the sense line; and a linear charge switch control circuit connected to the linear charge switch for turning on the switch at the beginning of a read cycle for a time sufficient to drain at least a portion of the linear charge from the memory element and subsequently closing the linear charge switch before the ferroelectric charge completely flows to the current source/sink. Preferably, the sense line is selected from the group consisting of a bit line and a plate line. Preferably, the memory element is selected from the group consisting of a ferroelectric capacitor and a ferroelectric FET. Preferably, the linear charge switch is selected from the group consisting of a transistor and a diode.

In another aspect, the invention provides a ferroelectric integrated circuit memory comprising: a memory cell comprising a ferroelectric memory element; a bit line; a word line; a plate line, and a precharge signal line; a first switch connected to the word line for electrically connecting the bit line and the ferroelectric memory element in response to a word signal on the word line and for electrically disconnecting the bit line and the ferroelectric memory element when the word signal is terminated; a current source/sink; a second switch connected to the precharge signal line for electrically connecting and disconnecting the bit line and the current source/sink in response to a precharge signal on the precharge signal line and electrically disconnecting the bit line and the current source/sink when the precharge signal is terminated; and a signal generator for, during a single read cycle, providing the precharge signal, then the word signal, and subsequently terminating the precharge signal. Preferably, the current source/sink comprises a ground. Preferably, the plate line is at constant voltage equal to one-half the supply voltage of the memory and the current source/sink comprises a ground. Preferably, the first and second switches are first and second transistors, each having a gate, and the word line is connected to the gate of the first transistor and the precharge line is connected to the gate of the second transistor. Preferably, the word signal and the precharge signal are boosted above the supply voltage of the memory. Preferably, the signal generator terminates the precharge signal before the ferroelectric memory element begins to switch. Preferably, the signal generator terminates the precharge signal while the ferroelectric memory element is switching.

In a further aspect, the invention provides a ferroelectric integrated circuit memory comprising: a memory cell comprising a ferroelectric memory element; a sense line electrically connected to or connectable to the ferroelectric memory element; and a current source/sink electrically connectable to the sense line for removing electric charge from the sense line while the sense line is electrically connected to the ferroelectric memory element. Preferably, the current source/sink is a ground.

In still another aspect, the invention provides a ferroelectric integrated circuit memory comprising: a memory cell comprising a ferroelectric memory element; a conducting line connected to or connectable to the ferroelectric memory element; a precharge signal line; a current source/sink; a switch connected to the precharge signal line for electrically connecting and disconnecting the conducting line and the current source/sink in response to a precharge signal on the precharge signal line and electrically disconnecting the conducting line and the current source/sink when the precharge signal is terminated; and a signal generator for generating a precharge signal that is boosted above the supply voltage of the memory. Preferably, the current source/sink is a ground.

In yet another aspect, the invention provides a method of reading a ferroelectric integrated circuit memory element having two electrical terminals, the method comprising the steps of: connecting a first line at a first voltage to one of the terminals of the ferroelectric memory element while a second voltage is applied to the other terminal of the ferroelectric memory element to create a voltage across the ferroelectric memory element and to cause linear displacement current to flow from the ferroelectric memory element to the first line; increasing the voltage across the ferroelectric memory element by drawing off at least a portion of the linear displacement current from the first line; and completing the reading of the ferroelectric memory element. Preferably, the step of connecting also causes ferroelectric switching current to flow from the ferroelectric memory element to the first line and the step of increasing further comprises drawing off a portion of the switching current from the first line. Preferably, the step of drawing off comprises connecting the first line to a current source/sink via a transistor having a gate and applying a voltage boosted above the supply voltage of the memory to the gate. Preferably, the step of connecting the first line to a current source/sink comprises connecting first line to a ground. Preferably, the step of connecting the first line at the first voltage comprises connecting the first line at zero voltage.

In still a further, aspect the invention provides a method of creating an increased switching voltage across a ferroelectric memory element in a ferroelectric memory, the ferroelectric memory element having two terminals, the method comprising the steps of: connecting a bit line to a current source/sink via a precharge transistor having a gate; applying a precharge signal to the gate, the precharge signal being boosted above the supply voltage of the memory; and connecting the bit line to one of the electrodes of the ferroelectric memory element while a second voltage is applied to the other electrode of the ferroelectric memory element to create the switching voltage across the ferroelectric memory element. Preferably, the bit line to a current source/sink comprises connecting the bit line to a ground. Preferably, the step of connecting the bit line to one of the electrodes comprises connecting the bit line to the one of the electrodes via a transistor having a gate and applying a word line signal to the gate, the word line signal being boosted above the supply voltage of the memory.

The invention also provides a method of creating an increased switching voltage across a ferroelectric memory element in a ferroelectric memory, the ferroelectric memory element having two terminals, the method comprising the steps of: connecting a conducting line to a current source/sink via a precharge switch to remove charge from the conducting line; connecting the conducting line to one of the terminals of the ferroelectric memory element while a second voltage is applied to the other terminal of the ferroelectric memory element to create the switching voltage across the ferroelectric memory element; and disconnecting the conducting line from the current source/sink and stopping the removal of charge from the conducting line before any significant amount of the ferroelectric material switches. Preferably, the step disconnecting comprises stopping the removal of charge from the conducting line when the voltage across the ferroelectric memory element reaches its maximum.

The invention not only increases the switching voltage to essentially the full supply voltage, but does so with no change in the memory cell and little change in the memory circuitry external of the memory cell. In the preferred embodiment, only the timing of the precharge signal is changed. Thus, the invention can be readily applied to state-of-the-art ferroelectric memories at little expense. Numerous other features, objects and advantages of the invention will become apparent from the following description when read in conjunction with the accompanying drawings.

DESCRIPTION OF THE PREFERRED EMBODIMENT

1. Overview

Figure 1:
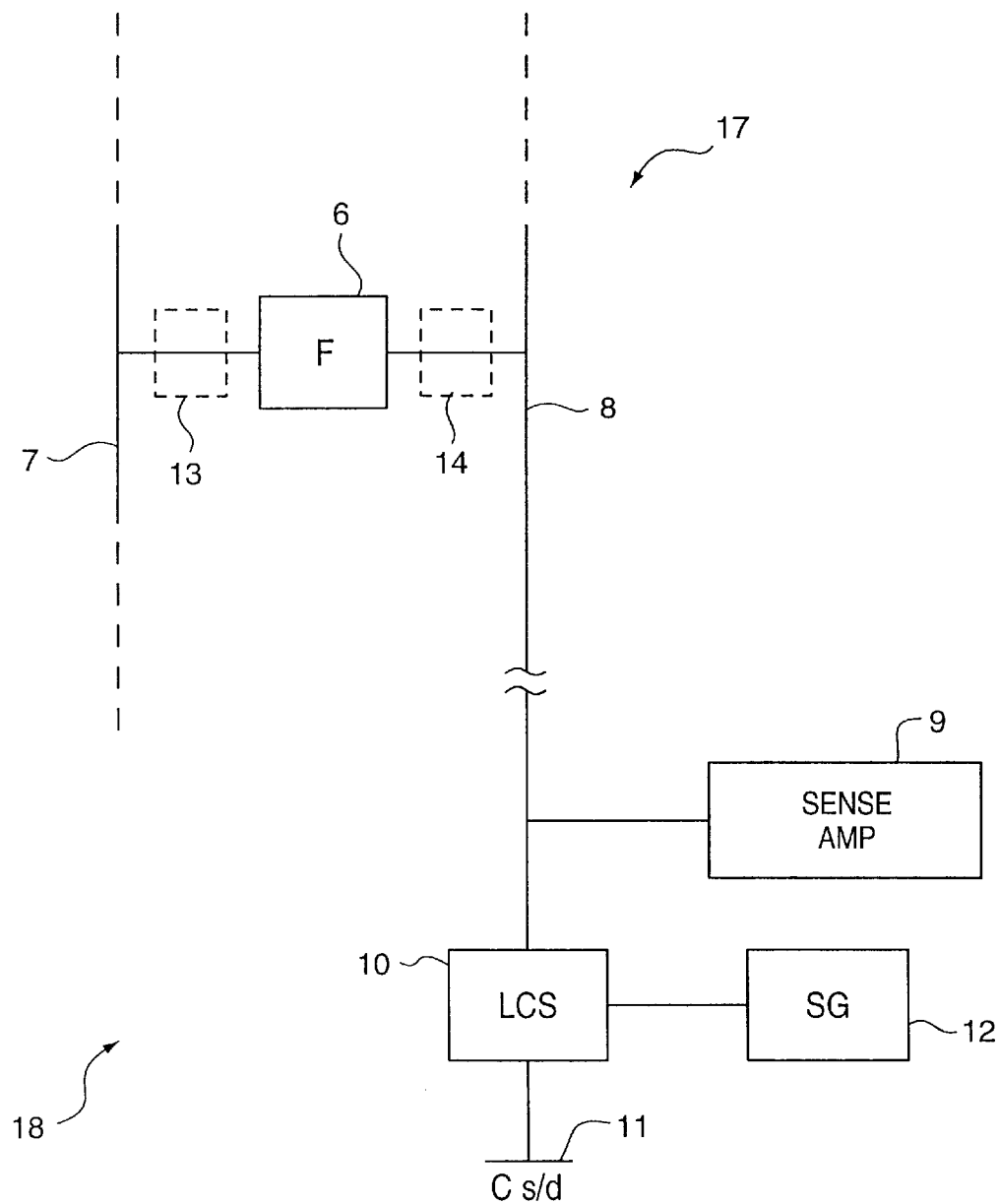
FIG. 1 is a block circuit diagram of a portion of a ferroelectric memory according to the invention.

Directing attention to FIG. 1, a generalized block diagram of a portion of a ferroelectric memory 18 according to the invention is shown. Memory 18 includes memory cell 17 including a ferroelectric memory element 6. Memory 18 also includes a first conducting line 7, a second conducting line 8, a sense amplifier 9, a linear charge switch 10, a current source/drain 11, and a signal generator 12. Memory cell 17 represents one of many identical memory cells in an array of memory cells. Memory cell 17 is programmed by placing a voltage across memory element 6 with lines 7 and 8. Memory cell 6 is read by sensing a charge, voltage, or current on line 8 with sense amplifier 9. In most ferroelectric memories, when memory cell 6 is read, both a linear charge and, if the ferroelectric element switches, a ferroelectric polarization charge flow into line 8. Only the ferroelectric polarization charge is of interest, because only it contains the information on the logic state of the cell. In the memory according to the invention the linear charge is removed to current source/drain 11, utilizing linear current switch 10. The removal of the linear charge is controlled by a signal generator 12 which activates and deactivates linear current switch 10 to connect and disconnect line 8 to current source/drain 11 at appropriate timing intervals.

FIG. 1 shows only the key elements related to the invention. An actual memory may include other elements, such as a switch between sense amp 9 and line 8. In the preferred embodiment discussed below, a switch 14, shown in ghost, is also located between line 8 and ferroelectric memory element 6. In this embodiment, line 8 is called a bit line, and line 7 is called a plate line. However, in another embodiment the plate line is sensed; in this embodiment, line 7 is the bit line, line 8 is the plate line, and a switch 13, shown in ghost, connects line 7 to ferroelectric element 6. Ferroelectric element 6 is a capacitor in the preferred embodiment, but can also be other ferroelectric elements, such as a ferroelectric FET. Current source/drain may be a current source or a current drain, depending on the sign of the linear charge to be removed. Linear charge switch 10 is a transistor in the preferred embodiment of the invention, but may also be a Schottky diode, back-to-back diodes or other electronic switch.

Figure 2:
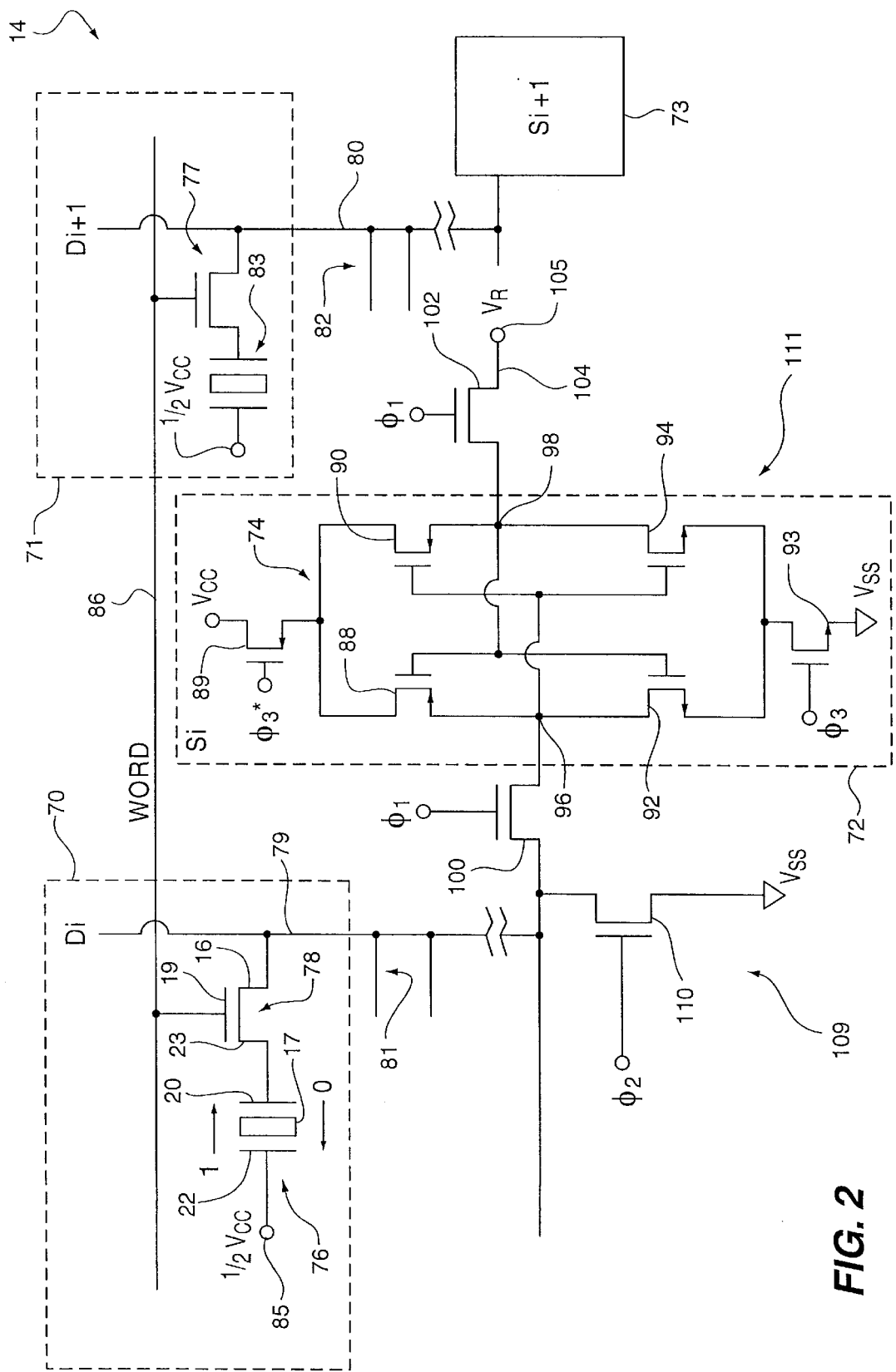
FIG. 2 is a circuit diagram of the preferred embodiment of a memory array according to the invention utilizing a 1T, 1C memory cell.

The invention will be described in detail in terms of a type of ferroelectric memory that is common in the art today, a portion of which is shown in FIG. 2. This ferroelectric memory includes two 1T, 1C (one transistor, one capacitor) memory cells 70 and 71, two sense amplifiers 72 and 73, and a precharge transistor 110 is shown. As will be shown in more detail below, transistor 110 can also be referred to as a "linear charge switch", since in the memory according to the invention, it not only acts to precharge the bit line, but it also acts to draw linear charge off the bit line to prevent it from interfering with the sensing. Memory cell 70 includes a transistor 78 and a ferroelectric capacitor 76. As in the conventional DRAM 1T, 1C memory cell, one of the source/drains 16 of transistor 78 is connected to a bit line 79, the other source/drain 23 of transistor 78 is connected to one electrode 20 of capacitor 76, and the gate 19 of transistor 78 is connected to a word line 86. The transistor 78 acts as a switch to connect and disconnect capacitor 76 from bit line 79 and is controlled by the signal on word line 86, which carries a signal that selects a row 14 of memory cells to be accessed. The bit line 79 carries the information signal to and from the cell 70. The other electrode or plate 22 of capacitor 14 is connected to a plate line 85, which in the preferred embodiment is a constant plate voltage source 85, which is preferably approximately one-half the supply voltage, which supply voltage is indicated as Vcc herein. Plate line or plate voltage source 85 is shown as a terminal to simplify the drawing, since in the preferred embodiment of the invention there is a single plate line which carries a single constant voltage, in contrast to some ferroelectric memories in which a plurality of different plate lines carry a varying voltage pulse. Each sense amplifier, such as 72, is preferably a cross-coupled latch 74, and senses the state of the ferroelectric capacitor 76 in memory cell 70, amplifies it, and restores it to its original state in one operation. Precharge transistor 110 connects bit line 79 to supply ground, designated Vss, when precharge signal $\phi_2$ is high. A similar precharge circuit is associated with memory cell 71 and sense amplifier 73, but is not shown to simplify the drawing. Further details of the structure and operation of the circuit of FIG. 2 will be discussed below.

Figure 5:
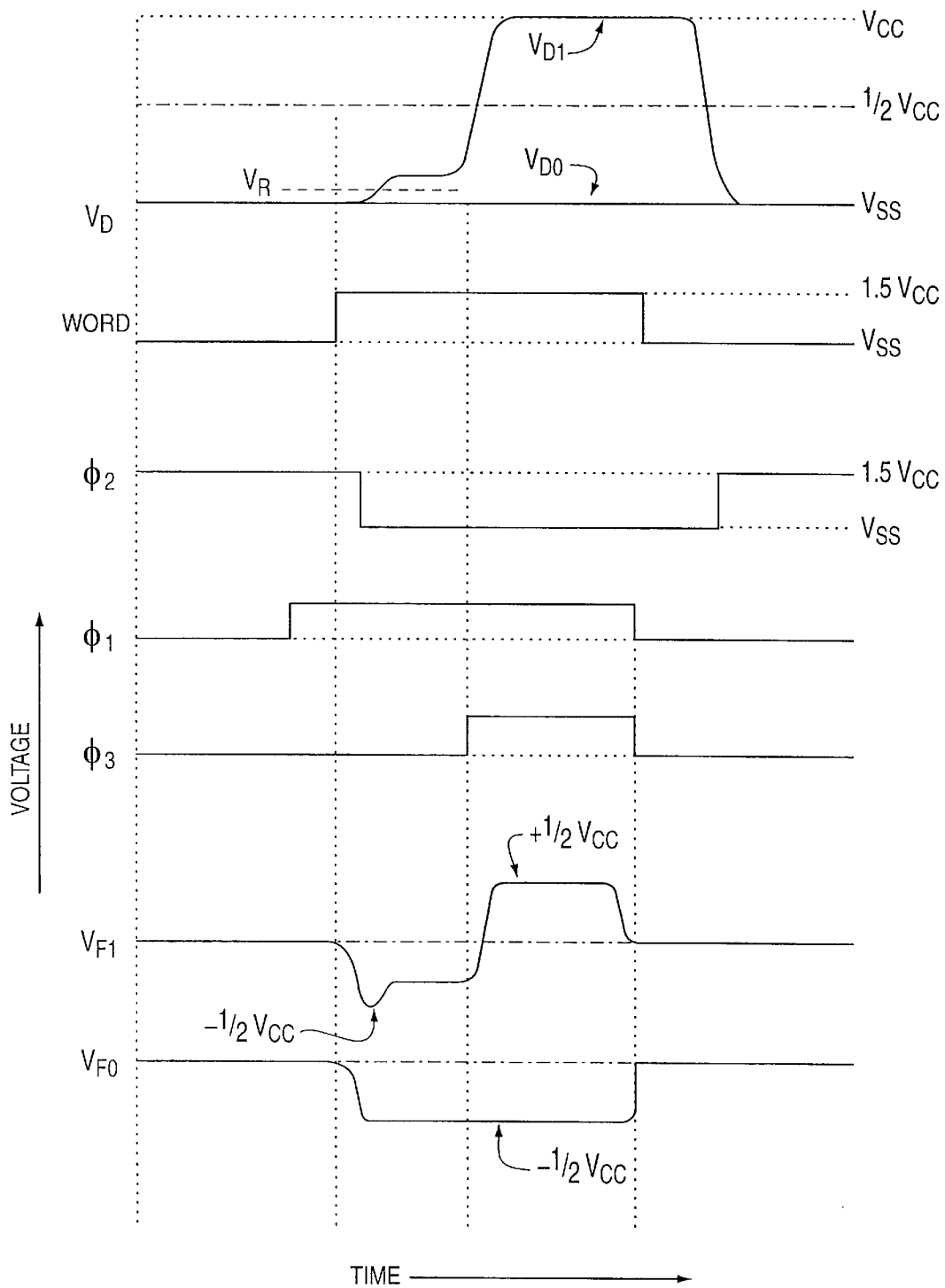
FIG. 5 shows the preferred embodiment of a timing diagram for the circuit of FIG. 4.
Figure 6:
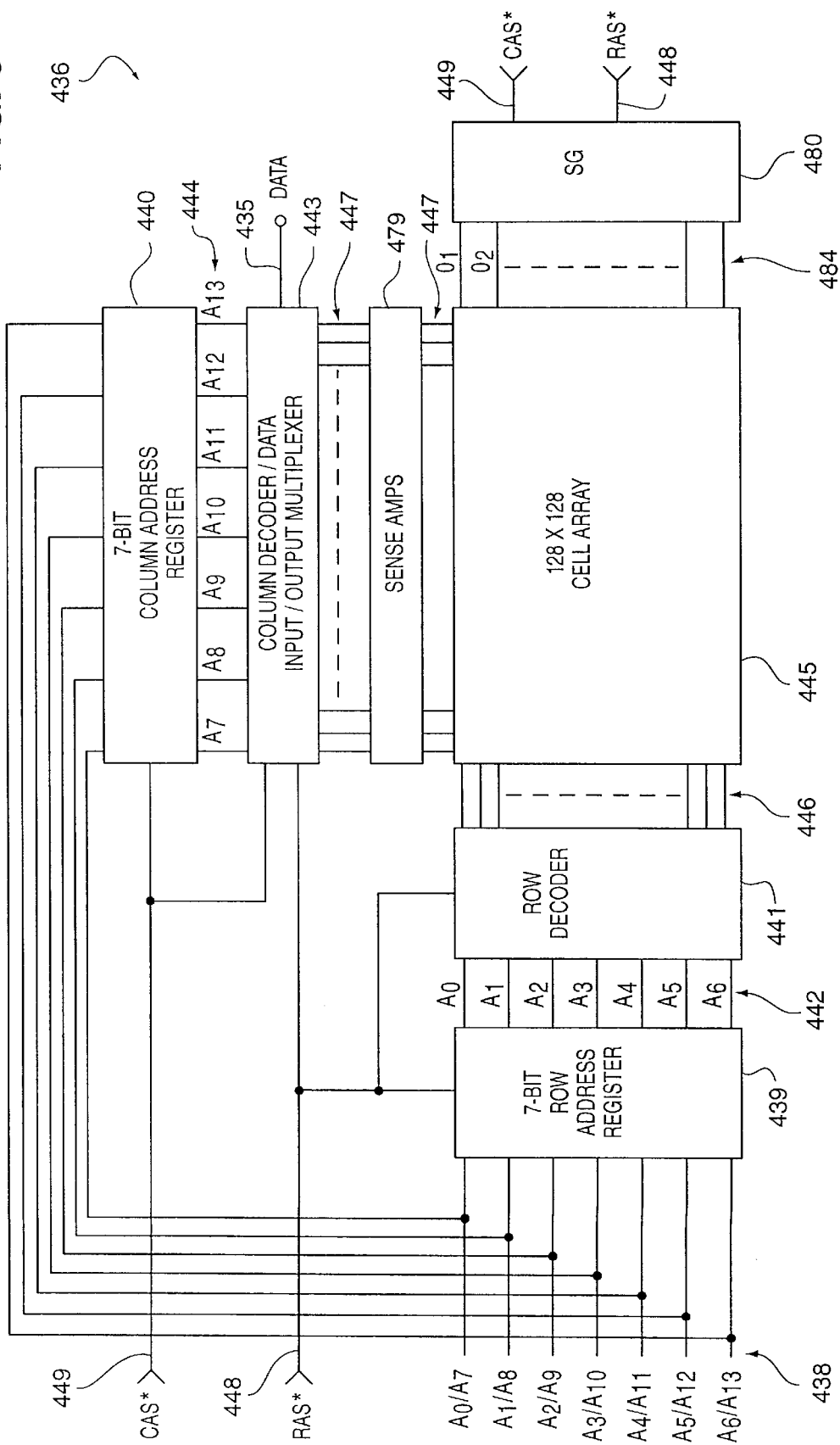
FIG. 6 shows an exemplary embodiment of a memory according to the invention that may utilize the memory arrays of FIGS. 1, 2 or 4.

As known in the art, a memory such as 436 (FIG. 6) is fabricated by arranging many memory cells, such as 70, 71, in rows and columns called an array. An exemplary memory 436 including a memory array 445 is shown in FIG. 6. Associated with the array 445 is a bank 479 of sense amplifiers, which includes sense amplifiers such as 72, 73. Referring to FIGS. 1 and 5, each of the memory cells such as 70 in array 445 is connected or connectable to a sense amplifier 72 in the bank 479 of sense amplifiers. Memory 436 will be discussed in more detail below.

The memory cell discussed above includes a ferroelectric capacitor, such as 76 in FIG. 2. In ferroelectric capacitors, the material 17 between the plates 20, 22 is a ferroelectric. As is well-known, a ferroelectric capacitor is capable of existing in two different states of polarization, represented by the arrows above and below capacitor 76. These states of polarization are created by an electric field of sufficient strength placed across the capacitor plates 20 and 22. If the field is in the direction from left to right in FIG. 2, then a polarization in the same direction (the direction of the upper arrow) remains after the field is removed. If the field is in the right-to-left direction, a polarization in the same direction (the direction of the lower arrow) remains after the field is removed. Thus, in one polarization state the ferroelectric capacitor 76 is polarized in the direction of the upper arrow, and in the other polarization state the ferroelectric capacitor 76 is polarized in the direction of the lower arrow. The ferroelectric memory is designed so that one polarization state corresponds to a logic "1" and the other polarization state corresponds to a logic "0". The designation of which state is a logic "1" and which is a logic "0" is arbitrary; in the cells of FIG. 2, we have designated the polarization in the left-to-right direction as the logic "1" state and the polarization in the right-to-left direction as the logic "0" state. The state of polarization is generally sensed by a sense amplifier, which amplifies the signal put out by the capacitor to a level that can be read by circuitry external of the memory array. The memories discussed herein are of a variety termed DRO (destructive read-out) because at least one of the polarization states is destroyed in the process of reading it. In such memories, the polarization must be restored to its original value after reading for the memory to retain the same information after reading as it did before reading.

Figure 4:
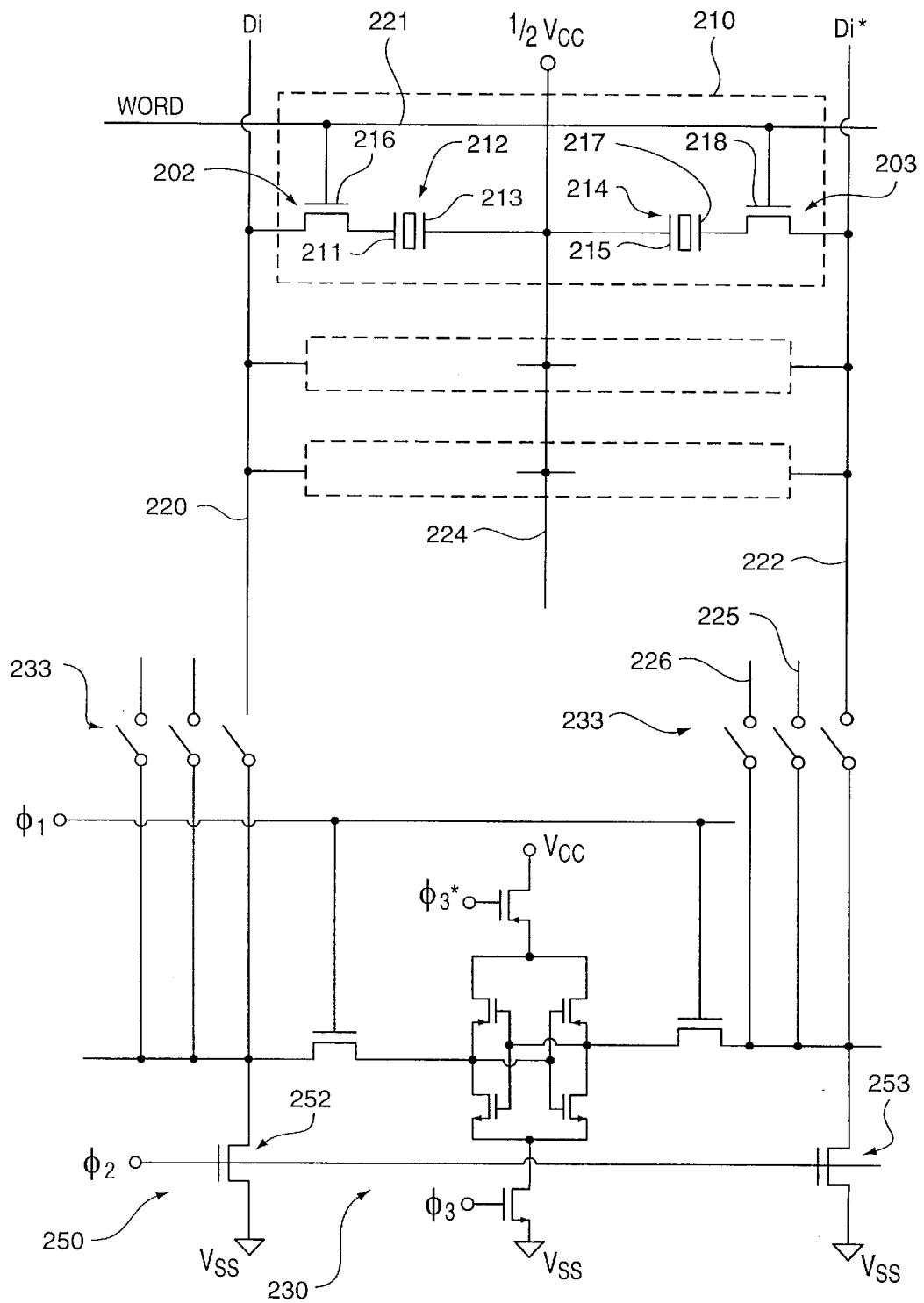
FIG. 4 is a circuit diagram of the preferred embodiment of a memory array according to the invention utilizing a 2T, 2C memory cell.

Another embodiment of a memory cell 210 and sense amp 230 combination is shown in FIG. 4. This figure illustrates a 2T, 2C (two transistor, two capacitor) memory cell 210. The gates 216, 218 of both transistors 202, 203 in the cell 210 are connected to the same word line 221. Bit line 220 is connected to transistor 202 and carries a signal Di. Bit line 222 is connected to transistor 203 and carries the signal Di*, the inverse signal to Di. In the discussion herein, a "*" indicates the inverse of a signal. Ferroelectric capacitors 212 and 213 are connected to the same plate line 224, which, again in this embodiment, carries a constant voltage, again preferably one-half Vcc. This embodiment also includes a precharge circuit including precharge transistors 252 and 253 and switches 233. When the signal $\phi_2$ is high, precharge transistors 252 and 253 turn on and a pair of bit lines, such as 220 and 222, are connected to circuit ground. This embodiment also will be discussed more fully below.

Figure 3:
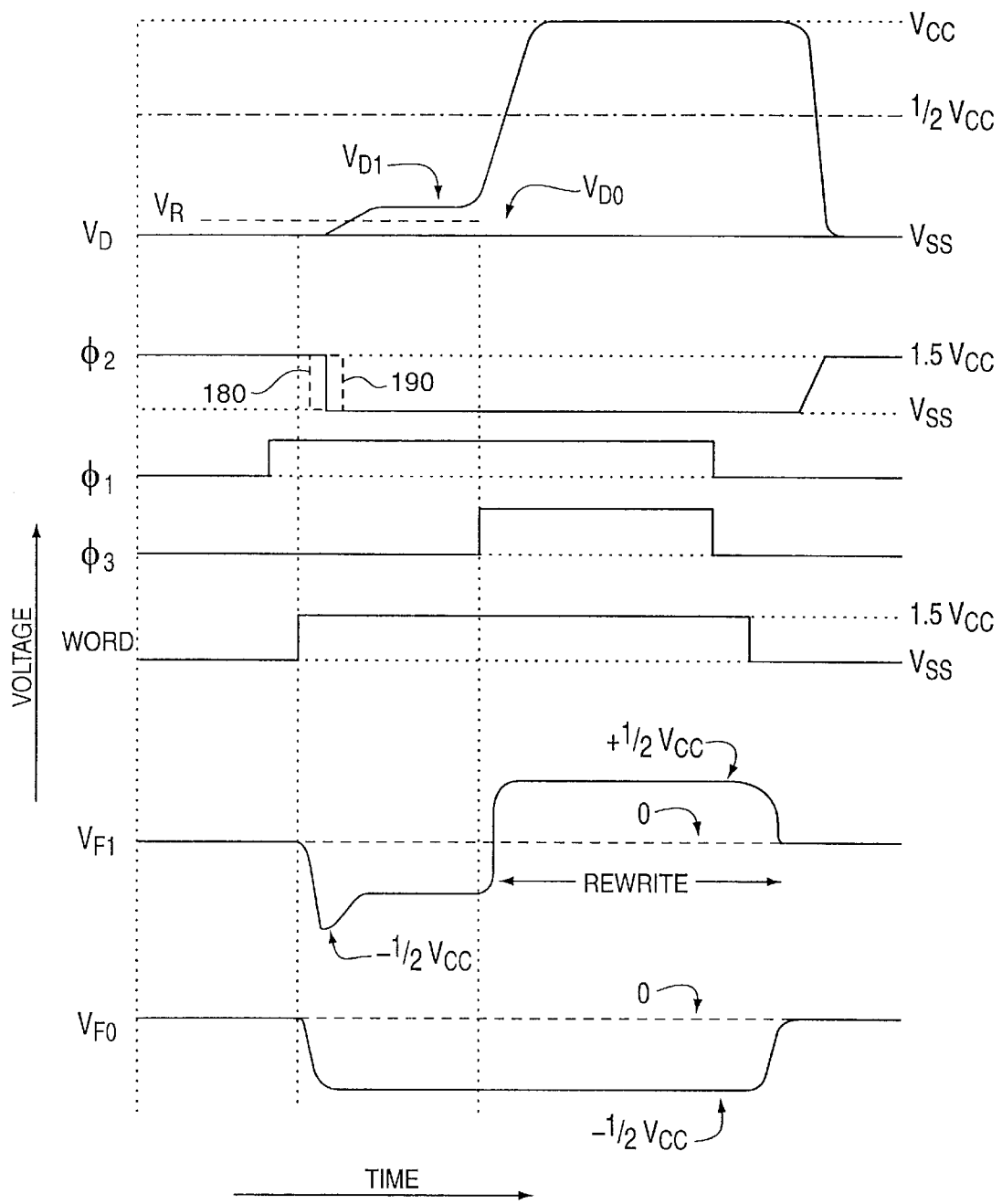
FIG. 3 shows the preferred embodiment of the timing diagram for the circuit of FIG. 2.

Timing diagrams useful in understanding the operation of the circuits of FIGS. 2 and 4 are shown in FIGS. 3 and 5, respectively.

A signal generator 480 (FIG. 6) in memory 436 produces the signal $\phi_2$ and other signals used in operation of memory 436. The invention involves a change in the timing in the precharge signal $\phi_2$, particularly in respect to the timing of the WORD signal applied to the gates of the memory cell transistors, such as 78. This change in timing allows the linear displacement charge from the ferroelectric capacitors, such as 76, to be drained off to ground, and therefore increasing the switching voltage, $V_F$, across the ferroelectric capacitors, such as 76, as compared to the prior art ferroelectric memories. In the case of the present embodiments, this means that the switching voltage reaches essentially a full +½ Vcc in one switching direction and essentially a full −½ Vcc in the other switching direction. That is, the memory utilizes the full supply voltage Vcc in switching the ferroelectric element. The details of the invention will be discussed more fully below. The word "essentially" is used herein in connection with the switching voltages because the internal impedance of the electronic circuit elements, such as the transistor 110, may prevent the switching voltages from spanning the full Vcc range. Preferably, the voltage lowering effect due to the internal impedance of transistor 110 is overcome by boosting the precharge signal $\phi_2$ to 1.5 Vcc.

It should be understood that the invention can be applied to many other ferroelectric memories than the embodiments described herein. It can be applied to any memory in which a flow of charge into a bit line lowers the effective switching voltage across the ferroelectric element. For example, depending on the ferroelectric material used in the ferroelectric element, the thickness of the material, and other factors, the ferroelectric domains within the element may switch essentially all at once, or may take a measurable time to switch. In the latter instance, the later-switching domains will not see the entire switching voltage, since the switching current flowing into the bit line reduces the voltage across the ferroelectric element. In this case, delaying the disconnection of the precharge circuitry even further until after some domains have switched, will allow the later switching domains to see a larger current. However, this reduces the amount of ferroelectric switching current available to provide an indication of the polarization state. Thus, if the invention is used in this case, the effect of increasing the switching voltage on total switching current produced and the effect of losing some switching current should be balanced against one another to maximize the total switching charge remaining when all the domains that will switch are switched.

It also should be recognized that the invention can be applied to memories utilizing ferroelectric switching elements other than capacitors. For example, it can be applied to memories utilizing ferroelectric FETs (Field Effect Transistors). For such a memory, see U.S. Pat. No. 5,523,964, which is hereby incorporated by reference as though fully disclosed herein.

2. Detailed Description of the Preferred Embodiments

Turning now to a more detailed description of the invention, FIG. 2 shows a portion of a memory utilizing 1T, 1C memory cells 70, 71. Each memory cell contains a ferroelectric capacitor 76 and a transistor. The structure of the individual memory cell has been discussed above. Memory cell 70 is in the ith column of memory array 445 and memory cell 71 is in the (i+1)th column. In each column, there are a plurality of identical memory cells, which is indicated by the lines 81, 82. The capacitor, such as 76, in each memory cell in the ith column is connected to bit line 79 via its associated transistor 78, while the capacitors, such as 83, in each memory cell in the (i+1)th column are similarly connected to bit line 80. Bit line 79 is labeled Di to indicate it carries the ith digit or bit line signal while bit line 80 is labeled Di+1 to indicate it carries the (i+1)th digit or bit line signal. The ith column of memory cells is connected to the ith sense amplifier 72 and the (i+1)th column is connected to the (i+1)th sense amplifier 73. It should be understood that embodiments in which more than one sense amplifier is associated with each column, or a single sense amplifier is associated with a plurality of columns, are also contemplated by the invention. A word line is associated with each row of memory cells, such as word line 86 which is connected to the gate of each transistor, such as 77 and 78, in the row containing cells 70 and 71. In each memory cell, such as 70, the side of the capacitor, such as 76, not connected to the transistor is connected to a source 85 of constant voltage, which is preferably one-half the supply voltage, Vcc.

Sense amplifier 72 preferably comprises a cross-coupled latch 74 comprising two p-type transistors 88 and 90 and two n-type transistors 92 and 94. The drains of the p-channel transistors 88 and 90 are connected to each other and also to the Vcc voltage via p-channel latch enable transistor 89; the sources of the n-channel transistors 92 and 94 are connected to each other and also to the Vss voltage via n-channel latch enable transistor 93. The source of p-channel transistor 88 is connected to the drain of n-channel transistor 92. The source of p-channel transistor 90 is connected to the drain of n-channel transistor 94. The node 96 between p-channel transistor 88 and n-channel transistor 92 is connected to the gates of transistors 90 and 94, while the node 98 between p-channel transistor 90 and n-channel transistor 94 is connected to the gates of transistors 88 and 92. The gates of latch enabling transistors 89 and 93 are connected to the $\phi_3$ signal input. Preferably, Vcc is a positive five volts and Vss is zero volts. The cross-coupled latch just described is a well-known CMOS cross-coupled latch. Other latches that drive the higher of two nodes to the logic "1" voltage and the lower of two nodes to the logic "0" voltage can be substituted for the latch 74.

Node 96 of latch 74 is connected to the bit line 79 via transistor 100, while node 98 is connected to a reference voltage line 104 via transistor 102. Preferably, reference voltage line 104 is connected to a source 105 of a reference voltage $V_R$. Preferably, $V_R$ is between the voltage assumed by the previously uncharged bit line 79 when the ferroelectric capacitor 76 is connected to it while in a logic "0" polarization state and the voltage assumed by the previously uncharged bit line 79 when ferroelectric capacitor 76 is connected to it while having a logic "1" polarization state. This voltage shall be discussed in more detail below. The gates of transistors 100 and 102 are connected to a line carrying the $\phi_1$ signal. Bit line 79 is also connected to the Vss (ground) voltage via precharge transistor 110 which has its gate connected to the $\phi_2$ signal line.

FIG. 3 is a timing chart showing the timing of the various signals input to and output by the circuit of FIG. 2 during a read cycle. In the timing charts and the discussion below, a voltage or other value that refers to a bit line will be labeled with an upper case subscript "D". A voltage or other parameter that refers to an operating ferroelectric capacitor, such as 76, will be labeled with a subscript "F". A voltage that refers to a state when the operating capacitor is in a logic "0" state will be labeled with a subscript "0", and voltage that refers to a state when the operating capacitor is in a logic "1" state will be labeled with a subscript "1". Thus, $V_D$ is the voltage on bit line 79, $V_{D1}$ is the voltage on the bit line 79 when the capacitor 76 is in a logic "1" state, that is, polarized in the direction of the arrow labeled 1 in FIG. 2, and $V_{D0}$ is the voltage on the bit line 79 when the capacitor 76 is in a logic "0" state, that is polarized in the direction of the arrow labeled 0 in FIG. 2. The voltage across the ferroelectric capacitor 76 when the capacitor is polarized in the logic "1" direction prior to the read process is designated by $V_{F1}$ and the voltage across the ferroelectric capacitor 76 when the capacitor is polarized in the logic "0" direction prior to the read process is designated by $V_{F0}$. The other signals are as designated in FIG. 2. The signal $\phi_3^*$ is not shown, since it is just the inverse of the signal $\phi_3$.

Referring to the timing diagram of FIG. 3, before the read cycle starts, $\phi_2$ is at 1.5 Vcc, thus bit line 79 is connected to ground via transistor 110 which discharges any charge that had previously been on the line. The WORD, $\phi_1$, and $\phi_3$ signals are low and the $\phi_3^*$ signal is high, holding transistors 78, 89, and 93 off. At the initiation of the read cycle, $\phi_1$ goes high, connecting the nodes 96, 98 of sense amplifier 72 to the bit line 79 and the reference voltage line 104, respectively. Then after a short delay to allow the bit line to stabilize, the word line 86 goes high connecting capacitor 76 to the bit line 79. Since the bit line is at ground and the plate line is at ½ Vcc, a voltage $V_F$ of −½ Vcc is placed across capacitor 76.

Preferably, the signal $\phi_2$ is boosted to 0.5 volts higher than Vcc. This reduces the internal impedance, increasing the speed of the precharge portion of the cycle, and reducing the overall time required for a memory cycle. If $\phi_2$ were not boosted, the voltage $V_F$ is not exactly −Vcc, since there is some internal impedance in transistor 110. As known in the art, the WORD signal on word line 86 is also boosted so that there is no drop in voltage across transistor 78. The invention has significant advantages even if the $\phi_2$ and WORD signals are not boosted, and thus the invention contemplates that $V_F$ may be essentially −½ Vcc; that is, different from the full voltage difference between plate line 85 and ground Vss by the amount by which the voltage drops across either transistor 110 or transistor 78, or both. However, in further discussion herein, we will assume that the $\phi_2$ signal and the WORD signal are boosted.

In response to the turning on of transistor 78, a linear displacement charge, $Q_I$, will develop on capacitor 76 as determined by the linear capacitance, $C_I$, of the capacitor 76, which linear displacement charge is approximately $Q_I = C_I$ (−½ Vcc). A negative charge will be developed on the plate 16 of capacitor 76. Thus, the movement of negative charge to the capacitor 76 would, in conventional ferroelectric memories, develop a positive voltage, $V_D$, on the bit line 79 approximately equal to:

$$V_D = Q_I / C_D, \qquad (1)$$

where $C_D$ is the capacitance of the bit line. However, in the memory according to the invention, the bit line is still connected to ground, and, therefore, the charge does not develop on the bit line; but rather the negative charge flows from ground to account for the negative charge on the plate 16 of capacitor 76, and the bit line stays at Vss. The voltage $V_F$ across the ferroelectric capacitor 76, ($V_{F1}$ and $V_{F0}$ in FIG. 3), rises to −½ Vcc. Thus, as compared to prior art ferroelectric memories, the voltage developed across the capacitor 76 in the memory according to the invention is larger by an amount as given by equation (1).

At about the same time as $V_F$ reaches its full value of −½ Vcc, $\phi_2$ goes low, turning off transistor 110. If the capacitor 76 is polarized in the logic "0" direction, then it is already polarized in the direction of the field, and the bit line voltage, $V_{D0}$ stays at Vss. The voltage across the ferroelectric capacitor, $V_{F0}$, stays at −½ Vcc. If, however, the capacitor 76 is polarized in the logic "1" direction, the polarization will initially be opposite to the direction of the field, and the field will cause the polarization to switch polarization states. The switching of the polarization state of capacitor 76 will cause a negative charge, $Q_{SW}$, to be drawn to capacitor 76, and therefore a positive voltage, $Q_{SW}/C_D$, will be developed on bit line 79. Thus, in the case of the memory cell being in the logic "1" state, the net voltage, $V_{D1}$, developed on the bit line 79 will be approximately equal to:

$$V_{D1} = Q_{SW} / C_D. \qquad (2)$$

The voltage across the ferroelectric capacitor 76, $V_{F1}$, drops by a corresponding amount. From the above, it is seen that the reference voltage $V_R$ is given by: $0 < V_R < Q_{SW}/C_D$, assuming Vss is equal to zero volts. Preferably, $V_R$ is halfway between zero and $Q_{SW}/C_D$ volts.

From the above, it is seen transistor 78 is a switch for permitting charge to be transferred between the ferroelectric capacitor 76 and the bit line 79, and transistor 110 is a switch permitting charge to be transferred between the bit line 79 and the voltage source/sink indicated by Vss. It is also evident that while the charge transfer is taking place, the logic state on the ferroelectric capacitor 76 is destroyed if the capacitor 76 was originally in a logic "1" state. Thus, in the case of the capacitor being in the logic "1" state, the capacitor 76 needs to be restored to its original state.

After a time that allows the ferroelectric transistor to switch and the bit line voltage to stabilize, the signal $\phi_3$ goes high and its inverse, $\phi_3^*$ goes low. This turns on transistors 93 and 89 and activates sense amplifier 72, that is, enables latch 74. If the voltage on bit line 79 is higher than reference voltage source 105, then gate transistor 88 will conduct better than transistor 90, since these are p-type transistors and the higher the voltage on their gates, the less they conduct. Further, transistor 94 will conduct better than transistor 92 since these are n-type transistors. As a result, the voltage at node 96 will increase while the voltage at node 98 will decrease. This in turn will further turn on transistors 94 and 88 and further turn off transistors 90 and 92, and so on, causing node 96 to rapidly go to Vcc and node 98 to rapidly go to Vss. This latches the latch 74 with node 96 at Vcc and node 98 at Vss. The Vcc voltage on bit line 79 does two things: first, it causes a logic "1" to be output as the Di signal to the circuit external of array 445 (FIG. 6) on one of lines 447; second, it causes a voltage of ½ Vcc to be placed across capacitor 76 in a direction to cause a polarization in the direction of the logic "1" arrow. Thus, the polarization is restored to the original logic "1" state.

If the voltage on bit line 79 is lower than reference voltage 105, then node 96 is driven to Vss while node 98 is driven to Vcc, which latches latch 74 in the state with node 98 at Vcc and node 96 at Vss. This again does two things: first, it causes a logic "0" to be output as the Di signal to the circuit external of array 445 (FIG. 6) on one of lines 447; second, it causes a voltage of ½ Vcc to be placed across capacitor 76 in a direction to cause a polarization in the direction of the logic "0" arrow. Thus, the polarization remains in the original logic "0" state.

After the state of capacitor 76 is restored, the signals $\phi_1$ and $\phi_3$ then go low and $\phi_3^*$ goes high, causing transistors 100, 102 and 89, 93, respectively, to turn off. The word line 86 then goes low, disconnecting capacitor 76 from bit line 79. The exact timing of the word line 86 going low is not critical, except that it should be sufficiently before $\phi_2$ going high to be sure transistor 78 is completely off. Then the $\phi_2$ signal returns high, turning on transistor 110 and discharging bit line 79. $V_{F1}$ and $V_{F0}$ are shown returning to zero volts. This is accomplished by way of a shunt system that is not discussed herein, since it is not part of this invention. For a full discussion of the shunt system, see U.S. patent application Ser. No. 08/931,023.

FIG. 4 shows another embodiment of the memory according to the invention. In this embodiment, the memory cell 210 is a 2T, 2C cell. The structure of the memory cell 210 has been discussed above. Each cell, such as 210, has two ferroelectric capacitors 212 and 214 which are identical. One plate 211 of capacitor 212 is connected to bit line 220 via transistor 216, while one plate 217 of capacitor 214 is connected to reference line 222 via transistor 218. The other plates 213 and 215 of capacitors 212 and 214, respectively, are connected to the constant voltage source via line 224. In this embodiment, the capacitors 212 and 214 take on opposite states, and the signals Di and Di* on the bit line 220 and reference line 222 are the inverse of each other. The sense amplifier 230, and its connection to the bit line 220, is the same as that of the circuit of FIG. 2; but now there are double the number of switches in the y-multiplexer 233, since there are a plurality of reference lines 222, 225, 226 etc., and connection must be made to these reference lines as well as the bit lines.

A timing chart for the circuit of FIG. 4 is shown in FIG. 5. The signals and voltages developed on the bit line 220 are essentially the same as in FIG. 3, thus will not be repeated. In this case, if cell 210 is in the logic "1" state, that is, capacitor 212 is polarized in the logic "1" state and capacitor 214 is polarized in the logic "0" state, then the voltage developed on bit line 220 will be $Q_{SW}/C_D$, and the voltage developed on reference line 222 will be Vss (zero). Since the voltage on line 222 will be smaller, the sense amplifier 230 will force line 220 to Vcc and line 222 to Vss. Similarly, if cell 210 is in the logic "0" state, that is, capacitor 212 is polarized in the logic "0" state and capacitor 214 is polarized in the logic "1" state, then the voltage developed on reference line 222 will be $Q_{SW}/C_D$, and the voltage developed on bit line 220 will be Vss (zero). Since the voltage on line 220 will be smaller, the sense amplifier 230 will force line 222 to Vcc and line 220 to Vss. Both capacitor 212 and capacitor 214 are restored to their original states in the reading process.

In both the embodiment of FIG. 3 and the embodiment of FIG. 5, the precharge transistor is preferably turned off and the removal of charge from the bit line stops at about the point where the plate voltage across the ferroelectric capacitor reaches its maximum but before a significant amount of the ferroelectric material switches. Here, "significant" means more than 40% of the total switchable domains in the ferroelectric material. Preferably, the transistor is turned off before 20% of the total switchable charge domains switch. The invention contemplates that the precharge transistor can be turned off at an earlier time, such as shown by the dashed line 180 in FIG. 3. The invention also contemplates that it may be turned off at a time after the voltage across the capacitor 76 reaches its maximum, such as shown by the dashed line 190 in FIG. 3. In the former case, not all the linear charge will be removed, but there will still be an increase in the switching voltage corresponding to the amount of linear charge that did get removed to ground. In the latter case, in the case where the ferroelectric switches, i.e. when it is in the logic "1" state in the example, the switching voltage will not drop as much as it does when the precharge transistor is turned off earlier. That is, in the $V_{F1}$ curve in FIG. 3, the voltage will stay closer to –½ Vcc in the portion of the cycle prior to the rewrite. This will have the advantage in that the switching voltage will remain higher in this case, but has the disadvantage that some of the ferroelectric switching charge is lost. In some materials where much more switching charge is produced at higher voltages, this can have a net advantage. The invention contemplates that the precharge transistor can be turned on at any time that is both subsequent to the word line going high and prior to the time the switching of the ferroelectric material stops.

As indicated above, FIG. 6 is a block diagram illustrating an exemplary integrated circuit memory 436 in which memory arrays of FIGS. 1 and 3 according to the invention are utilized. For simplicity, the embodiment shown is for a 16K×1 FERAM; however, the invention may be utilized in a wide variety of sizes and types of non-volatile memories. In the 16K embodiment shown, there are seven address input lines 438 which connect to a row address register 439 and a column address register 440. The row address register 439 is connected to row decoder 441 via seven lines 442, and the column address register 440 is connected to a column decoder/data input/output multiplexer 443 via seven lines 444. The row decoder 441 is connected to a 128×128 memory cell array 445 via 128 lines 446, and the column decoder/data input/output multiplexer 443 is connected to the sense amplifiers 479 and memory cell array 445 via 128 lines 347. A RAS* signal line 448 is connected to the row address register 439, row decoder 441, and column decoder/data input/output multiplexer 443, while a CAS* signal line 449 is connected to the column address register 440 and column decoder/data input/output multiplexer 443. An input/output data line 435 is connected to the column decoder/data input/output multiplexer 443.

Memory cell array 445 contains 128×128=16,384 memory cells, which is conventionally designated as 16K. The cell array 445 and the sense amplifiers 447 associated with it may include any of the combinations of memory cells and sense amplifiers discussed above. The operation of the memory 436 is as follows. Row address signals $A_0$ through $A_6$ and column address signals $A_7$ through $A_{13}$ placed on lines 438 are multiplexed via address registers 439,440 and the RAS* and CAS* signals to the row decoder 441 and column decoder/data input/output multiplexer 443, respectively. The row decoder 441 places a high signal on the one of the word lines 446 that is addressed. The column decoder/data input/output multiplexer 443 either places the data signal on line 435 on the one of the bit lines 447 corresponding to the column address, or outputs on the data line 435 the signal on the one of the bit lines 447 corresponding to the column address, depending on whether the function is a write or read function. As is known in the art, the read function is triggered when the RAS* signal precedes the CAS* signal, and the write function is triggered when the CAS* signal comes before the RAS* signal. The transistors such as 78 and 77 (FIG. 2) in the cells connected to the word line that is high turn on, permitting the data signal on the bit lines 79, 80 to be written into the capacitors 76 and 83 respectively, or the logic state on the capacitors 76, 83 to be read out on the bit lines 79, 80, respectively, as described above, depending on whether the write or read function is implemented. Other logic required or useful to carry out the functions outlined above, as well as other known memory functions, is also included in the memory 436 but is not shown or discussed as it is not directly applicable to the invention.

The ferroelectric materials, such as 17, utilized in the capacitors according to the invention are preferably layered superlattice materials, such as those described in U.S. Pat. No. 5,519,234 which is incorporated herein by reference as though fully disclosed herein. These materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium. A preferred layered superlattice material is strontium bismuth tantalate ($SrBi_2Ta_2O_9$).

It is a feature of the invention that there is very little difference between the architectures of the memory circuit according to the invention and state-of-the-art ferroelectric memories. The principal differences are in the signal generator 480 which produces signals with a different timing sequence than in the prior art memories. Thus, the only expense involved in redesigning a memory to incorporate the invention is to change the signal generator in a manner that one skilled in the art can easily accomplish, given the above disclosure. However, the invention is expected to eventually have significant impact on the design of ferroelectric memories, since it permits the use of smaller supply voltages and/or permits ferroelectric materials having less than perfect switching properties to operate more effectively. The invention also will reduce the incidence of failure of ferroelectric memories because the fundamental switching voltage is stronger for a given system. Perhaps most importantly, the invention gets rid of a serious constraint on previous designs. In previous ferroelectric memory designs, one was forced to design the ferroelectric capacitor, such as 76, so that $Q_{SW}>>Q_I$, so that the discrimination between the logic "1" voltage or the logic "0" voltage developed on bit line 79 the reference voltage 105 will be greater than the noise margin. Since $Q_I$ is related to $C_D$ and $V_D$ via equation 1, this puts corresponding constraints on the bit line capacitance and thus the number of memory cells that can be strung together on the same bit line. The invention significantly relaxes such constraints.

Another feature of the invention is that the read and write cycles of the ferroelectric memory according to the invention are little different in length than the read and write cycles of the fastest ferroelectric memories presently available. Since the switching time of a ferroelectric capacitor is a significant part of the cycles of these memories, and the switching time is inversely proportional to the electric field applied to the ferroelectric material, the higher switching voltage produced by the invention in fact decreases the total cycle time for a given memory design.

A further feature of the invention is that the precharge signal is optionally boosted. As discussed above, the boosted precharge signal increases the switching voltage. It should be noted that the boosting of the precharge signal is advantageous even when the precharge signal terminates prior to the word line going high, that is, with the conventional timing of a precharge signal.

There has been described a novel ferroelectric memory that provides a significantly higher switching voltage than prior art ferroelectric memories and at the same time is simple in design and fast in operation. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. Now that a simple method and apparatus for raising the switching voltage in a ferroelectric memory and the advantages of doing so have been disclosed, other methods and apparatus for doing the same can be substituted. For example, although the description has been in terms of a memory utilizing a transistor between the bit line and the ferroelectric memory cell, and which senses via the bit line, ferroelectric memories are known that sense through the plate line. See U.S. patent application Ser. No. 09/170,418, U.S. Pat. No. 5,995,407, which is incorporated herein by reference as though fully disclosed herein. The principles of the invention apply just as well to such memories, except that the current source/drain is connected to the plate line via the linear charge switch. The invention can also be applied to a memory such as that in the Anderson patent referenced above which uses a diode as a switch between the bit line and memory element. Ferroelectric memories are known which do not use a switch between the bit line and the ferroelectric memory element, and the invention will apply to these memories as well. Ferroelectric memories are also known that use a memory element other than a capacitor as the memory element, and the invention can be applied to these memories also. It is also evident that the signals discussed may in some instances occur in a different order; or equivalent structures and processes may be substituted for the various structures and processes described; or a variety of different circuits and ferroelectric materials may be used. Consequently, the invention is to be construed as embracing each and every novel feature and novel combination of features present in and/or possessed by the non-volatile memory and read and write processes described.

We claim:

1. A ferroelectric integrated circuit memory comprising:
    a memory cell comprising a ferroelectric memory element capable of storing a linear charge and a ferroelectric charge;
    a sense line connected to or connectable to said ferroelectric memory element;
    a current source/sink;
    a linear charge switch connected between said current source/sink and said sense line; and
    a linear charge switch control circuit connected to said linear charge switch for turning on said switch at the beginning of a read cycle for a time sufficient to drain at least a portion of said linear charge from said memory element and subsequently closing said linear charge switch before said ferroelectric charge completely flows to said current source/sink.

2. A ferroelectric memory as in claim 1 wherein said sense line is selected from the group consisting of a bit line and a plate line.

3. A ferroelectric memory as in claim 1 wherein said memory element is selected from the group consisting of a ferroelectric capacitor and a ferroelectric FET.

4. A ferroelectric memory as in claim 1 wherein said linear charge switch comprises a transistor.

5. A ferroelectric integrated circuit memory comprising:
    a memory cell comprising a ferroelectric memory element;
    a bit line; a word line; a plate line, and a precharge signal line;
    a first switch connected to said word line for electrically connecting said bit line and said ferroelectric memory element in response to a word signal on said word line and for electrically disconnecting said bit line and said ferroelectric memory element when said word signal is terminated;
    a current source/sink;
    a second switch connected to said precharge signal line for electrically connecting said bit line and said current source/sink in response to a precharge signal on said precharge signal line and electrically disconnecting said bit line and said current source/sink when said precharge signal is terminated; and
    a signal generator for, during a single read cycle, providing said precharge signal, then said word signal, and subsequently terminating said precharge signal.

6. A ferroelectric integrated circuit memory as in claim 5 wherein said current source/sink comprises a ground.

7. A ferroelectric integrated circuit memory as in claim 5 wherein said plate line is at constant voltage equal to one-half the supply voltage of said memory and said current source/sink comprises a ground.

8. A ferroelectric integrated circuit memory as in claim 5 wherein said first and second switches are first and second transistors, each having a gate, and said word line is connected to said gate of said first transistor and said precharge line is connected to said gate of said second transistor.

9. A ferroelectric integrated circuit memory as in claim 8 wherein said word signal and said precharge signal are boosted above the supply voltage of said memory.

10. A ferroelectric integrated circuit memory as in claim 5 wherein said signal generator terminates said precharge signal before said ferroelectric memory element begins to switch.

11. A ferroelectric integrated circuit memory as in claim 5 wherein said signal generator terminates said precharge signal while said ferroelectric memory element is switching.

12. A ferroelectric integrated circuit memory comprising:
    a memory cell comprising a ferroelectric memory element;
    a sense line electrically connected to or connectable to said ferroelectric memory element; and
    a current source/sink electrically connectable to said sense line for removing electric charge from said sense line while said sense line is electrically connected to said ferroelectric memory element.

13. A ferroelectric integrated circuit memory as in claim 12 wherein said current source/sink is a ground.

14. A ferroelectric integrated circuit memory comprising:
    a memory cell comprising a ferroelectric memory element;
    a conducting line connected to or connectable to said ferroelectric memory element;
    a precharge signal line;
    a current source/sink;
    a switch connected to said precharge signal line for electrically connecting said conducting line and said current source/sink in response to a precharge signal on said precharge signal line and electrically disconnecting said conducting line and said current source/sink when said precharge signal is terminated; and
    a signal generator for generating a precharge signal that is boosted above the supply voltage of said memory.

15. A ferroelectric integrated circuit memory as in claim 14 wherein said current source/sink is a ground.

16. A method of reading a ferroelectric integrated circuit memory element having two electrical terminals; said method comprising the steps of:
    connecting a first line at a first voltage to one of said terminals of said ferroelectric memory element while a second voltage is applied to the other terminal of said ferroelectric memory element to create a voltage across said ferroelectric memory element and to cause linear displacement current to flow from said ferroelectric memory element to said first line;
    increasing the voltage across said ferroelectric memory element by drawing off at least a portion of said linear displacement current from said first line; and
    completing the reading of said ferroelectric memory element.

17. A method of reading a ferroelectric integrated circuit memory element as in claim 16 wherein said step of connecting also causes ferroelectric switching current to flow from said ferroelectric memory element to said first line and said step of increasing further comprises drawing off a portion of said switching current from said first line.

18. A method of reading a ferroelectric integrated circuit memory element as in claim 16 wherein said step of drawing off comprises connecting said first line to a current source/sink via a transistor having a gate and applying a voltage boosted above the supply voltage of said memory to said gate.

19. A method of reading a ferroelectric integrated circuit memory element as in claim 18 wherein said step of connecting said first line to a current source/sink comprises connecting first line to a ground.

20. A method of reading a ferroelectric integrated circuit memory element as in claim 16 wherein said step of connecting said first line at said first voltage comprises connecting said first line at zero voltage.

21. A method of creating an increased switching voltage across a ferroelectric memory element in a ferroelectric memory, said ferroelectric memory element having two terminals, said method comprising the steps of:

connecting a bit line to a current source/sink via a precharge transistor having a gate;

applying a precharge signal to said gate, said precharge signal being boosted above the supply voltage of said memory; and connecting said bit line to one of said electrodes of said ferroelectric memory element while a second voltage is applied to the other electrode of said ferroelectric memory element to create said switching voltage across said ferroelectric memory element.

22. A method as in claim 21 wherein said step of connecting said bit line to a current source/sink comprises connecting said bit line to a ground.

23. A method as in claim 21 wherein said step of connecting said bit line to one of said electrodes comprises connecting said bit line to said one of said electrodes via a transistor having a gate and applying a word line signal to said gate, said word line signal being boosted above the supply voltage of said memory.

24. A method of creating an increased switching voltage across a ferroelectric memory element in a ferroelectric memory, said ferroelectric memory element having two terminals, said method comprising the steps of:

connecting a conducting line to a current source/sink via a precharge switch to remove charge from said conducting line;

connecting said conducting line to one of said terminals of said ferroelectric memory element while a second voltage is applied to the other terminal of said ferroelectric memory element to create said switching voltage across said ferroelectric memory element; and then disconnecting said conducting line from said current source/sink and stopping the removal of charge from said conducting line before any significant amount of the ferroelectric material switches.

25. A method as in claim 24 wherein said step disconnecting comprises stopping the removal of charge from said conducting line when said voltage across said ferroelectric memory element reaches its maximum.

* * * * *